United States Patent
Clark et al.

(10) Patent No.: US 10,615,141 B2
(45) Date of Patent: Apr. 7, 2020

(54) PNICTIDE BUFFER STRUCTURES AND DEVICES FOR GAN BASE APPLICATIONS

(71) Applicant: IQE plc, St. Mellons, Cardiff (GB)

(72) Inventors: Andrew Clark, Mountain View, CA (US); Rytis Dargis, Oak Ridge, NC (US); Michael Lebby, San Francisco, CA (US); Rodney Pelzel, Emmaus, PA (US)

(73) Assignee: IQE plc, St. Mellons, Cardiff (GB)

( * ) Notice: Subject to any disclaimer, the term of this patent is extended or adjusted under 35 U.S.C. 154(b) by 0 days.

(21) Appl. No.: 16/306,547

(22) PCT Filed: Jun. 2, 2017

(86) PCT No.: PCT/US2017/035794
§ 371 (c)(1),
(2) Date: Nov. 30, 2018

(87) PCT Pub. No.: WO2017/210622
PCT Pub. Date: Dec. 7, 2017

(65) Prior Publication Data
US 2019/0139761 A1    May 9, 2019

Related U.S. Application Data

(60) Provisional application No. 62/344,439, filed on Jun. 2, 2016, provisional application No. 62/385,744, filed on Sep. 9, 2016.

(51) Int. Cl.
*H01L 23/00* (2006.01)
*H01L 21/02* (2006.01)
(Continued)

(52) U.S. Cl.
CPC .......... *H01L 24/32* (2013.01); *H01L 21/0251* (2013.01); *H01L 21/02381* (2013.01);
(Continued)

(58) Field of Classification Search
CPC .......... H01L 29/2003; H01L 21/02546; H01L 21/02543; H01L 21/0251; H01L 21/02505;
(Continued)

(56) References Cited

U.S. PATENT DOCUMENTS 8,542,437 B1 * 9/2013 Lebby .................. H01S 5/3031
359/344
8,796,121 B1 * 8/2014 Dargis .................. C30B 25/22
438/496

(Continued)

FOREIGN PATENT DOCUMENTS

EP   1595280   11/2005
WO   WO 2015/152736   10/2015

OTHER PUBLICATIONS

F. E. Arkun et al.; Scalable GaN-on-Silicon Using Rare Earth Oxide Buffer Layers, 2012, ECS Transactions, 50 (9) 1065-1071 (2012). (Year: 2012).*

(Continued)

*Primary Examiner* — Syed I Gheyas
(74) *Attorney, Agent, or Firm* — Haley Guiliano LLP

(57) ABSTRACT

A structure can include a III-N layer with a first lattice constant, a first rare earth pnictide layer with a second lattice constant epitaxially grown over the III-N layer, a second rare earth pnictide layer with a third lattice constant epitaxially grown over the first rare earth pnictide layer, and a semiconductor layer with a fourth lattice constant epitaxially grown over the second rare earth pnictide layer. A first difference between the first lattice constant and the second lattice constant and a second difference between the third lattice constant and the fourth lattice constant are less than one percent.

15 Claims, 5 Drawing Sheets

(51) Int. Cl.
   *H01S 3/09*       (2006.01)
   *H01S 3/16*       (2006.01)
   *H01S 5/30*       (2006.01)
   *H01L 29/20*      (2006.01)
   *H01L 29/205*     (2006.01)
   *H01L 29/267*     (2006.01)

(52) U.S. Cl.
   CPC .. *H01L 21/02389* (2013.01); *H01L 21/02439* (2013.01); *H01L 21/02483* (2013.01); *H01L 21/02491* (2013.01); *H01L 21/02502* (2013.01); *H01L 21/02505* (2013.01); *H01L 21/02543* (2013.01); *H01L 21/02546* (2013.01); *H01L 24/94* (2013.01); *H01L 29/2003* (2013.01); *H01L 29/205* (2013.01); *H01L 29/267* (2013.01); *H01S 3/09* (2013.01); *H01S 3/1603* (2013.01); *H01S 3/1605* (2013.01); *H01S 3/1611* (2013.01); *H01S 3/1628* (2013.01); *H01S 3/1655* (2013.01); *H01S 5/3031* (2013.01); *H01L 21/0262* (2013.01); *H01L 21/02532* (2013.01); *H01L 2224/291* (2013.01); *H01L 2224/29082* (2013.01); *H01L 2224/29193* (2013.01); *H01L 2224/32145* (2013.01); *H01L 2924/01033* (2013.01); *H01L 2924/01064* (2013.01); *H01L 2924/01068* (2013.01); *H01L 2924/0505* (2013.01); *H01L 2924/0525* (2013.01); *H01L 2924/0545* (2013.01); *H01L 2924/10253* (2013.01); *H01L 2924/10335* (2013.01); *H01S 5/30* (2013.01); *H01S 2301/17* (2013.01)

(58) Field of Classification Search
   CPC ......... H01L 21/02381; H01L 21/02532; H01L 2924/10335; H01L 2924/10253; H01L 2924/0545; H01L 2924/0525; H01L 2924/0505; H01L 2924/01068; H01L 2924/01064; H01L 2924/01033; H01S 3/1603
   See application file for complete search history.

(56) References Cited

U.S. PATENT DOCUMENTS

| | | |
|---|---|---|
| 9,142,406 B1 | 9/2015 | Dargis et al. |
| 2015/0069409 A1* | 3/2015 | Dargis .............. H01L 21/02433 257/76 |
| 2015/0203990 A1 | 7/2015 | Dargis et al. |
| 2015/0228484 A1 | 9/2015 | Dargis et al. |

OTHER PUBLICATIONS

Hall et al. Growth of ScN epitaxial films by plasma-assisted molecular beam epitaxy, *Journal of Crystal Growth*, vol. 311, No. 7, Mar. 2009, pp. 2054-2057.

International Search Report and Written Opinion in Application No. PCT/US2017/035794, dated Aug. 14, 2017 (14 pages).

King et al., "Gas source molecular beam epitaxy of scandium nitride on silicon carbide and gallium nitride surfaces", Journal of Vacuum Science and Technology: Part A, vol. 32, No. 6, Jul. 24, 2014.

\* cited by examiner

PNICTIDE BUFFER STRUCTURES AND DEVICES FOR GAN BASE APPLICATIONS

CROSS-REFERENCE TO RELATED APPLICATIONS

This application is a national stage application under 35 U.S.C. § 371 of International Application PCT/US17/35794, filed Jun. 2, 2017 which claims priority to U.S. Provisional Application Ser. No. 62/344,439, filed Jun. 2, 2016, and U.S. Provisional Application Ser. No. 62/385,744, filed Sep. 9, 2016, each of which is hereby incorporated herein by reference in its entirety.

BACKGROUND

Epitaxy, epitaxial growth, and epitaxial deposition refer to growth or deposition of a crystalline layer on a crystalline substrate. The crystalline layer is referred to as an epitaxial layer. The crystalline substrate acts as a template and determines the orientation and lattice constant of the crystalline layer. The crystalline layer can be, in some examples, lattice matched or lattice coincident. A lattice matched crystalline layer can have the same or a very similar lattice constant as the top surface of the crystalline substrate. Lattice matched layers are advantageous between semiconductor materials because they allow for a region of band gap change to be formed in material without introducing a change in crystal structure. This allows construction of devices such as light-emitting diodes, transistors, and radio frequency filters.

Pnictides is the name given to alloys formed from a rare-earth and a group V element such as N, As or P. Some previous uses of pnictides in buffers include GaN grown on ScN buffers due to the relatively small lattice mismatch between these two nitride alloys. Another previously reported example is the use of ErAs in GaAs based device structures (such as solar cells) as tunnel junctions due its semi metallic behavior. The semi metallic characteristic is an attribute shared by most pnictide alloys. Other pnictides based on a rare earth and nitrogen combination (RE+N), such as GdN have been studied and reported on for their ferromagnetic properties. Each of these examples is very limited in its use to the specific characteristic described.

SUMMARY

Systems and methods are described herein for the use of rare-earth based pnictide alloys to grow buffers between a III-N base and a second semiconductor material. The systems and methods described herein further include the placement of an isolating layer within a pnictide buffer to electrically isolate the second semiconductor material from the underlying III-N base.

The systems and methods described herein may include a III-N layer with a first lattice constant, a first rare earth pnictide layer with a second lattice constant epitaxially grown over the III-N layer, a second rare earth pnictide layer with a third lattice constant epitaxially grown over the first rare earth pnictide layer, and a semiconductor layer with a fourth lattice constant epitaxially grown over the second rare earth pnictide layer. A first difference between the first lattice constant and the second lattice constant and a second difference between the third lattice constant and the fourth lattice constant may be less than one percent.

The first rare earth pnictide layer may comprise an alloy comprising Sc and a rare earth element, wherein the alloy is represented by $Sc_xRE_{1-x}N$, wherein x is greater than zero and less than or equal to one.

In some examples, the III-N layer may be part of a device epitaxially grown over one of a GaN substrate, a Si substrate, a SiC substrate, and a sapphire substrate. The III-N layer may comprise a GaN material. The III-N layer may comprise one or more of Al, Ga, and In.

The second rare earth pnictide layer may comprise at least two rare earth pnictide layers. Each of the rare earth pnictide layers may have a different fixed lattice constant.

The structure may further include a third rare earth pnictide layer between the first rare earth pnictide layer and the second rare earth pnictide layer. The third rare earth pnictide layer may have a fifth lattice constant that varies across a thickness of the third rare earth pnictide layer. Furthermore, the third rare earth pnictide layer may have a first surface adjacent to the first rare earth pnictide layer and a second surface adjacent to the second rare earth pnictide layer. The fifth lattice constant may be graded to match the first lattice constant at the first surface and to match the second lattice constant at the second surface.

In one embodiment, the III-N layer may comprise GaN; the first rare earth pnictide layer may comprised ScN; the second rare earth pnictide layer may comprise a first alloy comprising Sc, a rare earth element, and N; the third rare earth pnictide layer may comprise a second alloy comprising the rare earth element, N, and As, and the semiconductor layer may comprise GaAs.

In one embodiment, the III-N layer may comprise GaN; the first rare earth pnictide layer may comprise ScN; the second rare earth pnictide layer may comprise a first alloy comprising Sc, a rare earth element, and N; the third rare earth pnictide layer may comprise a second alloy comprising the rare earth element, N, and P; and the semiconductor layer may comprise Si.

In one embodiment, the III-N layer may comprise GaN; the first rare earth pnictide layer may comprise ScN; the second rare earth pnictide layer can comprise a first alloy comprising Sc, a rare earth element, and N; the third rare earth pnictide layer may comprise a second alloy comprising the rare earth element, N, and As; and the semiconductor layer may comprise InP.

These embodiments can further comprise an isolating layer within the third rare earth pnictide layer. These embodiments may also further comprise a first electrical contact connected to the third rare earth pnictide layer and a second electrical contact may be connected to the second rare earth pnictide layer.

The III-N layer can be part of a transistor.
The III-N layer can be part of a diode.
The III-N layer can be part of an radio frequency filter.

BRIEF DESCRIPTION OF THE DRAWINGS

The above and other features of the present disclosure will be more apparent upon consideration of the following detailed description, taken in conjunction with the accompanying drawings in which.

DETAILED DESCRIPTION

In the following description, numerous details are set forth for the purpose of explanation. However, one of ordinary skill in the art will realize that the embodiments described herein may be practiced without the use of these specific details. In other instances, well-known structures and devices are shown in block diagram form so that the description will not be obscured with unnecessary detail.

The system and methods described herein provide rare-earth based pnictide alloys included in buffers positioned between a III-N base and a second semiconductor material. One object of the systems and methods described herein is to use a pnictide buffer region (PBR) to epitaxially join two device structures in a single process step. With the correct design of the PBR, the two device structures can be constructed from dissimilar III-V semiconductors, including connecting III-N and GaAs, III-N and InP, III-N and silicon, or other such combinations. The PBR itself can also add functionality to the final device structure by providing a front contact material for a first device and both a front contact material for the first device and a back contact material a second device. It would be highly advantageous to include rare-earth based pnictide alloys in buffers positioned between nitride-based semiconductors and other types of semiconductors.

For any of the examples and embodiments described herein, a layer of III-N material, often shown as GaN herein, can be part of a first device. This first device could include, for example, a transistor, a diode, a light emitting diode (LED), Al(In)GaN LED, Al(In)GaN field effect transistor (FET), a radio frequency (RF) filter, or any other suitable semiconductor device. In an example, the III-N layer is the final layer of the first device. The PBR is then epitaxially grown on the III-N layer. For any of the examples described herein, the first layer substrate of a second device may be a substrate made of a layer of semiconductor material, such as silicon, SiC sapphire, GaN, or any other suitable substrate material.

Figure 1:
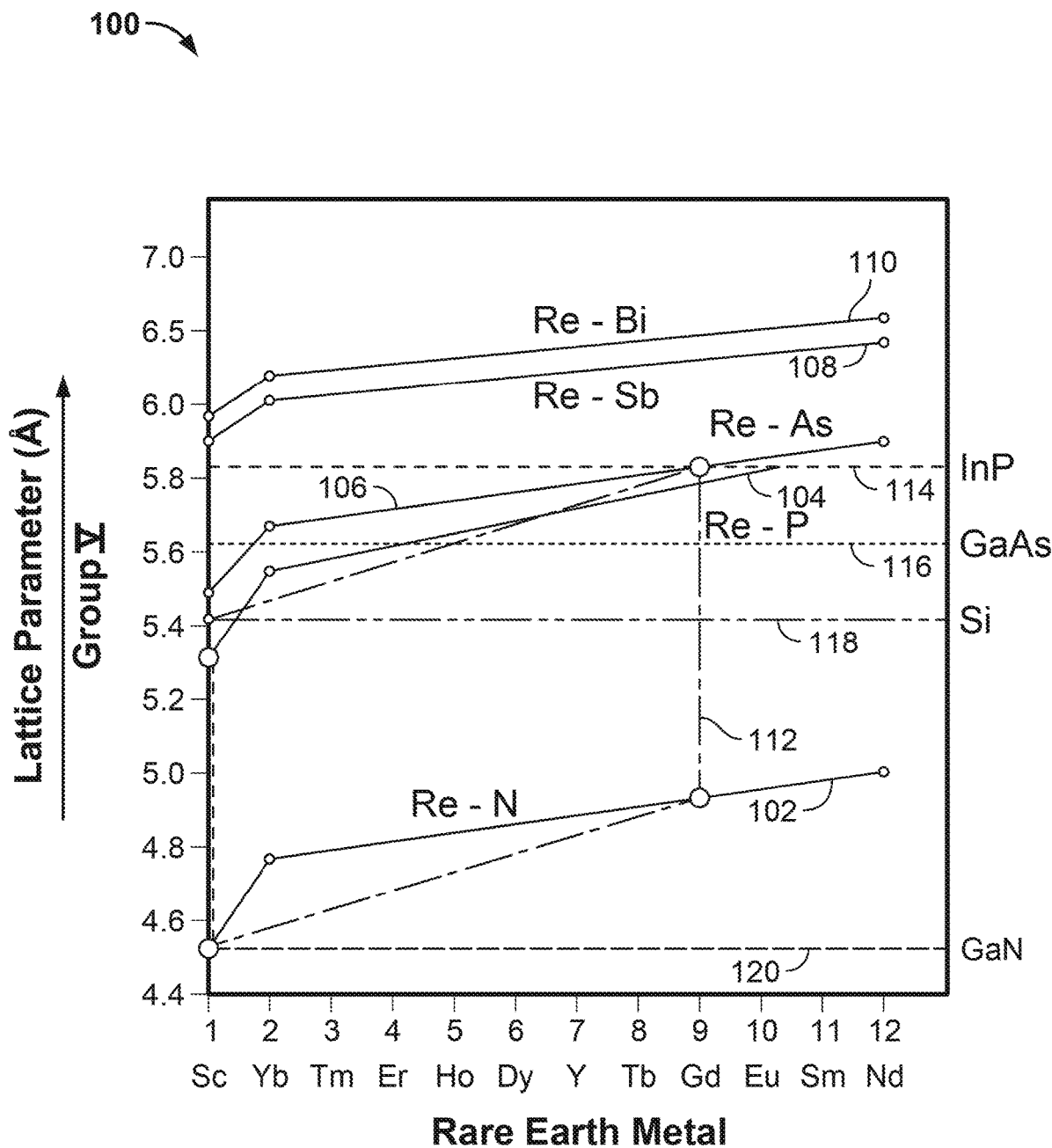
FIG. 1 depicts a pnictide alloy map illustrating lattice constant of pnictides with various group V species and rare-earth elements, according to an illustrative implementation.

FIG. 1 is a graph 100 showing a typical representation of pnictide alloys. The systems and methods of the present disclosure are not limited to binary constructions and may include two, three, four, five, or any suitable number of elements. However, for simplicity, only binary constructions are shown in FIG. 1. Pnictide alloys can, for example, include two rare earth elements, such as Sc—Er or Gd—Nd, or two group V elements, such as N—P or P—As. The general form for pnictide alloys as used herein is: $(Re1_{1-x}Re2_x)V$ or $Re(V1_{1-y}V2_y)$, where Re represents a rare earth element and V represents a group V element.

In graph 100, the horizontal axis represents rare earth elements in increasing order of atomic number, and the vertical axis represents lattice constants, which may be referred to herein as lattice parameter or lattice spacing. Rare earth alloys are shown grouped according to the group V species contained in the pnictide alloy. Curve 102 represents how the lattice constant of a Re—N alloy changes as the rare earth element in the alloy changes. As is depicted in the graph 100, the lattice constant of Re—N compounds generally increases as the atomic number of the rare earth element in the alloy increases. For example, ScN has a lower lattice constant (shown at the lower left corner of polygon 112) than GdN (shown in the lower right corner of polygon 112), both of which are on curve 102. Similarly, curve 104 represents how the lattice constant of a Re—P alloy changes, curve 106 represents how the lattice constant of a Re—As alloy changes, curve 108 represents how the lattice constant of a Re—Sb alloy changes, and curve 110 represents how the lattice constant of a Re—Bi alloy changes as the rare earth element in the alloy changes.

The systems and methods of this disclosure use or incorporate a mixed pnictide buffer to bridge a lattice mismatch between a III-N material (such as GaN, whose lattice constant is shown as horizontal line 120) and a second semiconductor material, such as GaAs (whose lattice constant is shown as horizontal line 116), InP (horizontal line 114), or silicon (horizontal line 118). In the example shown in FIG. 1, the lattice mismatch is represented by the difference in lattice constant coordinate between the horizontal line 120 and the horizontal lines 114, 116, and 118. When GaN is the III-N material, the first epitaxial material adjacent to GaN may be selected to be ScN, which is essentially lattice matched to GaN according to the graph 100. The graph 100 is a pnictide alloy map that allows for correct lattice constants for a lattice match to be determined or engineered. The polygon 112 illustrates a specific example of determining correct lattice constants using this pnictide alloy map. In this example, InP (the upper right corner of polygon 112) is incorporated in one device and GaN (the lower left corner of polygon 112) is incorporated in another device. The PBR that links these two semiconductor materials may include a quaternary pnictide alloy constructed from 2 rare earths and 2 group V materials. Such an alloy may be represented by the general form $(RE1_{1-x}RE2_x)(V1_{1-y}V2_y)$. The upper right corner of polygon 112 represents an intersection of InP lattice constant 114 and Re—As curve 106. This intersection point is an indication that the lattice constant of GdAs is the same or nearly the same as that of InP. Because GdAs and InP have similar lattice constants, they are considered to be lattice matched. Compared to two materials that are not lattice matched, when GdAs is epitaxially grown over InP, the likelihood of defects and the number or concentration of defects is lower. A specific example of such a structure is described in relation to FIG. 9 and is provided as an illustrative example only. In general, it will be understood that the present disclosure may also be used with ternary or quaternary alloys.

Figure 2:
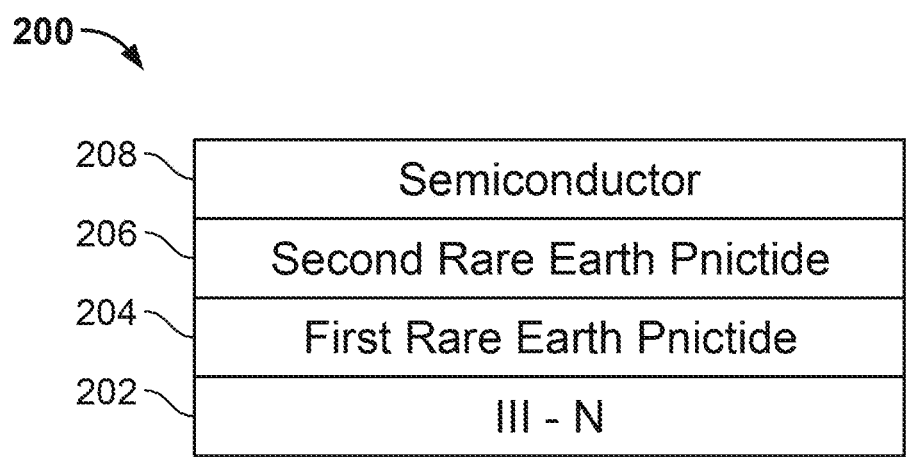
FIG. 2 depicts a layer diagram including a pnictide buffer region with two rare earth pnictides, according to an illustrative implementation.
Figure 3:
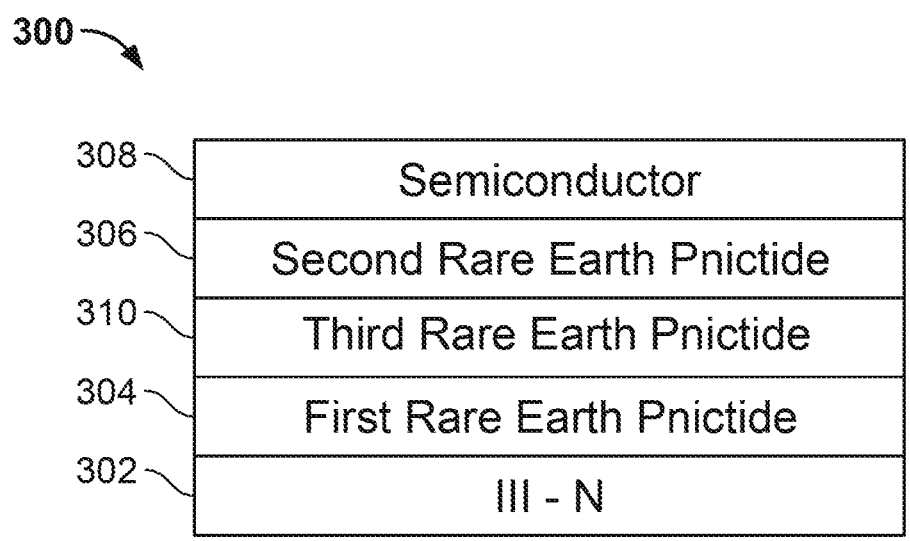
FIG. 3 depicts a layer diagram including a pnictide buffer region with three rare earth pnictides, according to an illustrative implementation.
Figure 4:
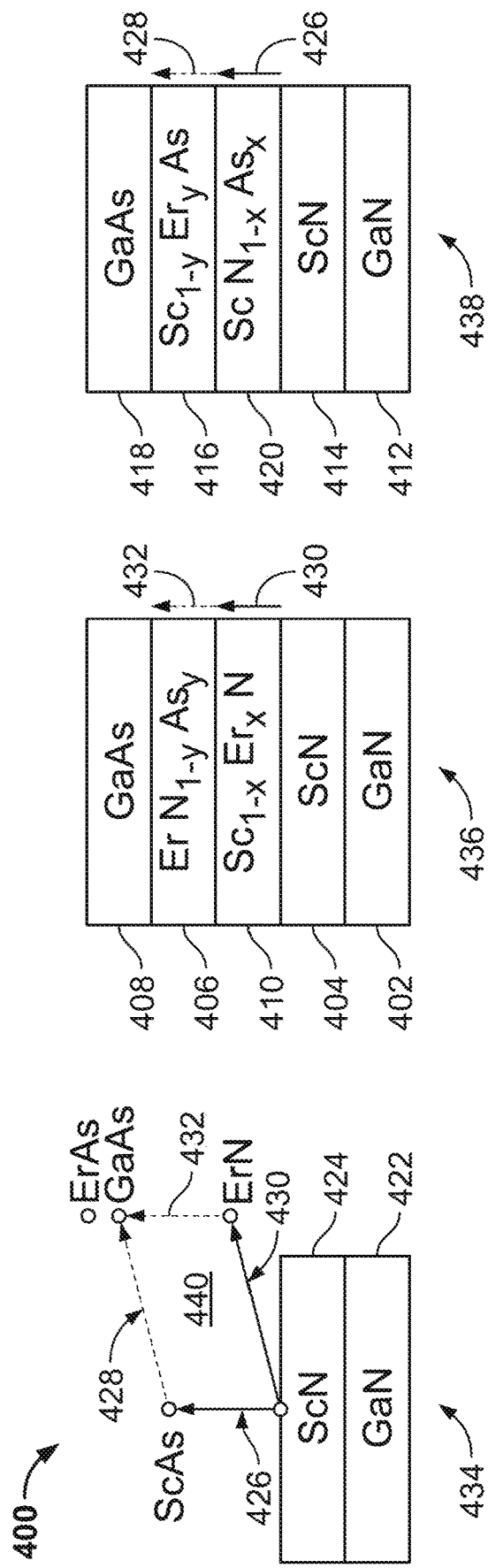
FIG. 4 depicts layer diagrams including GaN and GaAs layers, according to an illustrative implementation.
Figure 5:
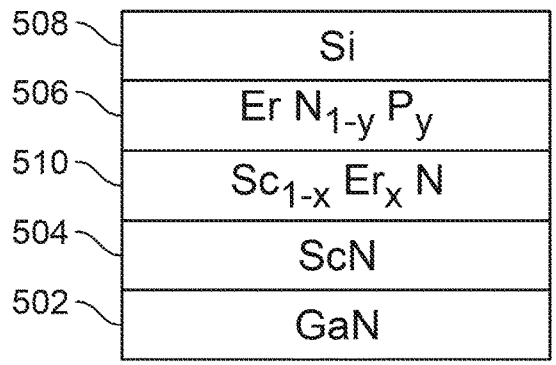
FIG. 5 depicts a layer diagram including GaN and Si layers, according to an illustrative implementation.
Figure 6:
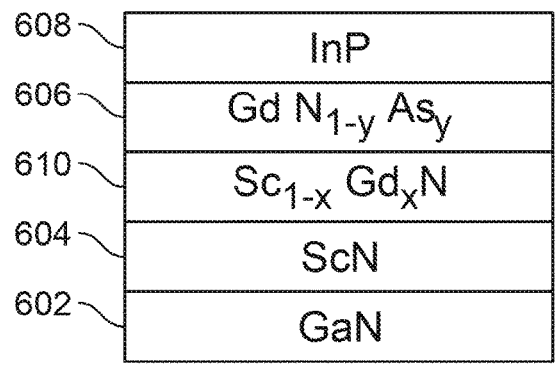
FIG. 6 depicts a layer diagram including GaN and InP layers, according to an illustrative implementation.
Figure 7:
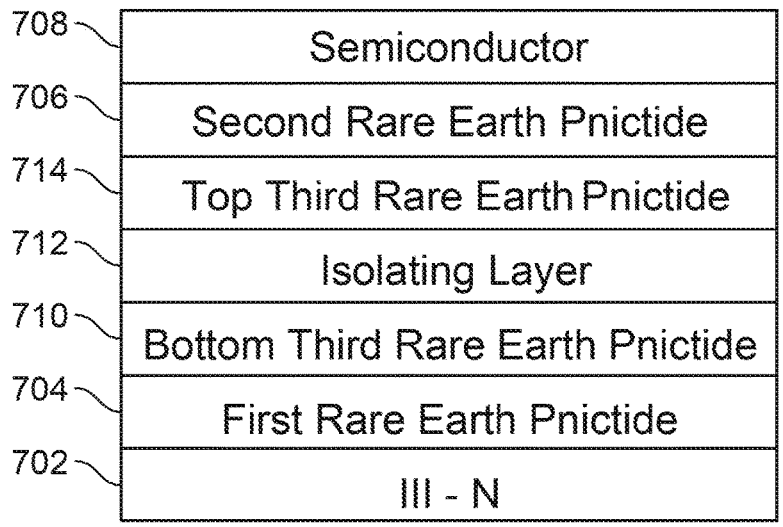
FIG. 7 depicts a layer diagram including a pnictide buffer region with three rare earth pnictides and an isolating layer, according to an illustrative implementation.
Figure 8:
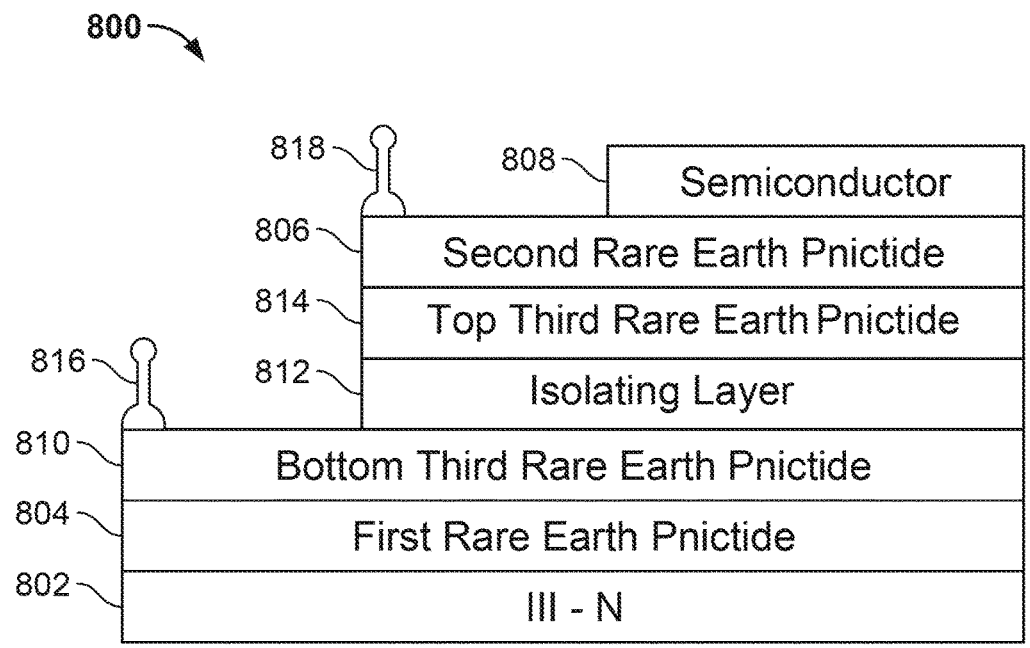
FIG. 8 depicts a layer diagram including electrical contacts, according to an illustrative implementation.
Figure 9:
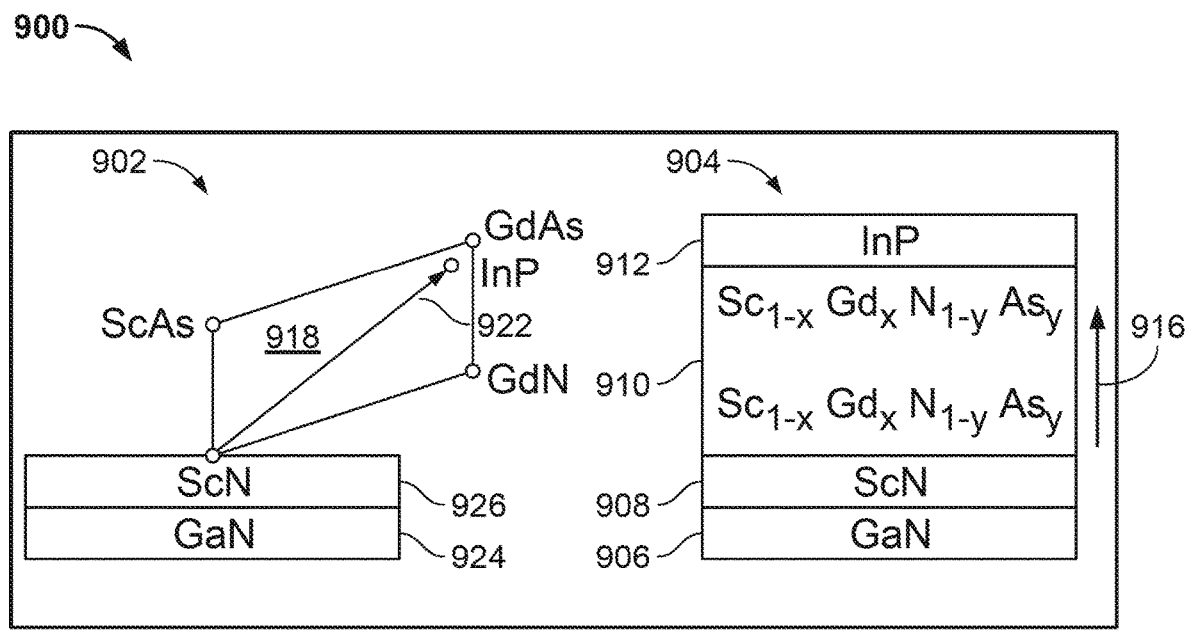
FIG. 9 depicts layer diagrams including a pnictide buffer region with a gradient, according to an illustrative implementation.

One object of the systems and methods described herein is to use a pnictide buffer region (PBR) to epitaxially join two device structures in a single process step. As used herein, a stack refers to a series of materials deposited on one another through techniques to build and connect device structures. FIGS. 2 and 3 show exemplary stacks including a PBR. In these stacks, the PBR (made of at least two rare-earth pnictides) joins a III-N layer and a semiconductor layer. FIGS. 4-6 show example implementations of the stack with three rare-earth pnictides on a III-N layer (shown as GaN). FIG. 7 shows an example stack that includes an isolating layer within the PBR. FIG. 8 shows an example stack in a device with electrical contacts. FIG. 9 shows a stack with a III-N layer (GaN) connected to a semiconductor (InP) by a PBR. In this stack, the PBR includes rare-earth pnictide layers, wherein one of the layer's element composition varies along a gradient. FIGS. 4 and 9 include polygons similar to the polygon 112 in FIG. 1, which depicting relationships between lattice constants of the rare earth pnictides, III-N material, and semiconductor in their respective stacks.

FIG. 2 is a simplified layer diagram showing an example stack 200 that includes a PBR. The base of the stack 200 is a III-N layer 202 that has a first lattice constant. A first rare earth pnictide layer 204 is epitaxially grown over the III-N layer 202 and has a second lattice constant that is slightly different from the first lattice constant. The absolute difference between the first lattice constant and the second lattice constant is small, but is greater than 0 and is generally below some threshold, such as 4%, 3%, 2%, 1%, 0.5%, or any other suitable amount. Such a difference between two lattice constants constitutes a lattice match between the III-N layer and the first rare earth pnictide layer.

A second rare earth pnictide layer 206 is epitaxially grown over the first rare earth pnictide layer 204. The second rare earth pnictide layer 206 has a third lattice constant that is different from both the first and second lattice constants. A semiconductor layer 208 is epitaxially grown over the second rare earth pnictide layer 206. The semiconductor layer 208 has a fourth lattice constant that is different from the first, second, and third lattice constants. In an embodiment, the absolute difference between the second lattice constant and the third lattice constant is small, but is greater than 0 and is generally below some threshold, such as 4%, 3%, 2%, 1%, 0.5%, or any other suitable amount. In an embodiment, the third lattice constant is graded throughout a thickness of the layer such that the composition varies and causes the third lattice constant to vary from the first lattice constant to the fourth lattice constant. Therefore, the choice of rare earth pnictides to use in such a stack as is shown in simplified layer diagram 200 can be based on the difference in lattice constant between materials.

FIG. 3 depicts diagram of a stack 300 including a PBR with three rare earth pnictide layers. The stack 300 is similar to the stack 200 shown in FIG. 2, but includes a third rare earth pnictide layer 310 between the first rare earth pnictide layer 304 and second rare earth pnictide layer 306. The base of the stack 300 is a III-N layer 302 that has a first lattice constant. The first rare earth pnictide layer 304 is epitaxially grown over the III-N layer and has a second lattice constant that is different from the first lattice constant. Layer 302 is similar to layer 202; layer 304 is similar to layer 204; layer 306 is similar to layer 208; layer 308 is similar to layer 208; and the descriptions of the layers 202, 204, 206, and 208 in FIG. 2 are applicable to the layers 302, 304, 306, 308 in FIG. 3.

A third rare earth pnictide layer 310 is epitaxially grown over the first rare earth pnictide layer 304. The third rare earth pnictide layer 306 has a fifth lattice constant that varies across a thickness of the third rare earth pnictide layer. The third rare earth pnictide layer 310 has a first surface (depicted as a bottom surface in FIG. 3) that is adjacent to the first rare earth pnictide layer 304 and a second surface (depicted as a top surface in FIG. 3) that is adjacent to the second rare earth pnictide layer 306. In one example, the fifth lattice constant is graded throughout a thickness of the layer 310 such that the composition varies and causes the fifth lattice constant to vary from the first lattice constant (at the first surface) to the second lattice constant (at the second surface). Alternatively, the fifth lattice constant may be fixed throughout the thickness of the third and be the same as or different than the first, second, third, or fourth lattice constants.

In one embodiment, the III-N layer 302 comprises GaN; the first rare earth pnictide layer 304 comprises ScN; the third rare earth pnictide layer 310 comprises a first alloy comprising Sc, a rare earth element, and N; the second rare earth pnictide layer 306 comprises a second alloy comprising the rare earth material, N, and As; and the semiconductor 308 layer comprises GaAs.

FIG. 4 depicts three layer diagrams 434, 436, and 438, each including a GaN layer and a ScN layer, according to an illustrative implementation of the present disclosure. Layer diagrams 436 and 438 each include a GaAs layer, while layer diagram 434 illustrates a schematic representation, similar to polygon 112 of FIG. 1, of engineering a PBR buffer design for bridging the lattice mismatch between GaN and GaAs. Polygon 440 can be used to navigate a pnictide alloy map (such as that shown in FIG. 1) to determine lattice matched alloys, but polygon 440 bridges the lattice mismatch between GaN and GaAs, rather than GaN and InP as shown in polygon 112 in FIG. 1. In an example, because ScN is lattice matched to GaN, a layer 424 of ScN is first epitaxially grown on GaN layer 422. ScN is transitioned (represented by arrow 426) to ScAs. Because ErAs is lattice matched to GaAs, ScAs is then transitioned (represented by arrow 428) to ErAs. In an example, ScN is transitioned (represented by arrow 430) to ErN. ErN is transitioned (represented by arrow 432) to ErAs.

Layer diagrams 436 and 438 represent example stacks that may be constructed according to the schematic 434. In an example, layer diagram 436 illustrates a two part buffer utilizing ternary alloys for a GaAs semiconductor material 408 (top layer) and a GaN semiconductor material 402 (bottom layer). In this example, the III-N layer is GaN semiconductor material 402, the first rare earth pnictide layer is ScN 404, the third rare earth pnictide layer is $Sc_{1-x}Er_xN$ 410, the second rare earth pnictide layer is $ErN_{1-y}As_y$ 406 and the semiconductor layer is GaAS semiconductor material 408.

The values x and y are used to determine the proportional amount of respective elements within the layer. The variable x ranges from approximately 0 at a bottom surface to approximately 1 at a top surface. In some embodiments, the values x and y vary along the thickness of layer 410 and layer 406 respectively, creating a compositional grade along the thickness of the layers. At the intersection between third rare earth pnictide 410 and first rare earth pnictide ScN, the value of x is at or near 0, at which point the third rare earth pnictide layer 410 is composed entirely or almost entirely of ScN. As the $Sc_{1-x}Er_xN$ layer 410 is grown and approaches the layer 406, x increases along arrow 430. As x increases, the amount of Sc in $Sc_{1-x}Er_xN$ layer 410 decreases, while the amount of Er increases proportionally. Throughout the thickness of layer 410, x has a value between 0 and 1 creating a pnictide alloy containing Sc, Er, and N. At the intersection between third rare earth pnictide layer 410 and second rare earth pnictide layer 406, the value of x is at or near 1, at which point the third rare earth pnictide layer 410 is composed entirely or almost entirely of ErN.

The variable y ranges from approximately 0 at a bottom surface to approximately 1 at a top surface. At the intersection between third rare earth pnictide layer 410 and second rare earth pnictide layer 406, the value of y is at or near 0, at which point the second rare earth pnictide layer is composed entirely or almost entirely of ErN. At the intersection between layers 406 and $Sc_{1-x}Er_xN$ 410, the layers $ErN_{1-y}As_y$ 406 and $Sc_{1-x}Er_xN$ 410 are lattice matched because they both consist entirely or almost entirely of ErN. As the $ErN_{1-y}As_y$ layer 406 is grown and approaches the layer GaAs layer 408, y increases along arrow 432. As y increases the amount of N in $ErN_{1-y}As_y$ layer 406 decreases, while the amount of As increases proportionally. Throughout the thickness of layer 406, y occupies a value between 0 and 1 creating a pnictide alloy containing Er, N, and As. At the intersection between second rare earth pnictide 406 and semiconductor layer GaAs 408, the value of y is at or near 1, at which point the third rare earth pnictide layer 410 is composed entirely or almost entirely of ErAs. ErAs and GaAs are lattice matched, as shown in FIG. 1. Therefore at the intersection between layer $ErN_{1-y}As_y$ 406 and GaAs layer 408, the layers $ErN_{1-y}As_y$ 406 and GaAs 408 are be lattice matched. By providing a transition in lattice constant from the GaN layer 436 to the GaAs layer 408, the rare earth pnictide layers (404, 406, 410) allow for epitaxial growth of the GaAs layer 408 with minimal defects.

Layer diagram 438 depicts another way to achieve lattice matched PBR bridging GaN and GaAs. In layer diagram 438, a three part buffer utilizes ternary alloys for bridging an upper GaAs semiconductor material 418 and a lower GaN semiconductor material 412. In this example, the III-N layer is GaN semiconductor material 412, the first rare earth pnictide layer is ScN 414, the third rare earth pnictide layer is $ScEr_{1-x}As_x$ 420, the second rare earth pnictide layer is $Sc_{1-y}Er_yAs$ 416 and the semiconductor layer is GaAs semiconductor material 418.

Similar to layers 406 and 410 of layer diagram 436, rare earth pnictide layers $Sc_{1-x}Er_yAs$ 416 and $ScN_{1-x}As_x$ 420 are compositionally graded along their thicknesses. The variable x ranges from approximately 0 at a bottom surface to approximately 1 at a top surface. The variable y ranges from approximately 0 at a bottom surface to approximately 1 at a top surface. In this example, x increases along arrow 426, while y increases along arrow 428. At the intersection between layers $Sc_{1-x}Er_xN$ 416 and $ScN_{1-x}As_x$ 420, the layers 416 and 420 are lattice matched because they both include entirely or almost entirely of ScAs. The value of y increases along arrow 428, until $Sc_{1-y}Er_yAs$ layer 416 is comprised entirely or almost entirely of ErAs. ErAs and GaAs are lattice matched, as shown in FIG. 1. Therefore at the intersection between layer $ErN_{1-y}As_y$ 416 and GaAs layer 418, the layers $ErN_{1-y}As_y$ 416 and GaAs 418 are lattice matched. By providing a transition in lattice constant from the GaN layer 412 to the GaAs layer 418, the rare earth pnictide layers (414, 416, 420) allow for epitaxial growth of the GaAs layer 418 with minimal defects.

In one embodiment, a III-N layer comprises GaN; a first rare earth pnictide layer comprises ScN; a second rare earth pnictide layer comprises a first alloy comprising Sc, a rare earth material, and N; a third rare earth pnictide layer comprises a second alloy comprising the rare earth material, N, and P, and the semiconductor layer comprises Si. FIG. 5 depicts a layer diagram 500 of this embodiment, according to an illustrative implementation. Layer diagram 500 depicts a two part PBR buffer utilizing ternary alloys for a conductive buffer between GaN and Si. In this example, the III-N layer is GaN semiconductor material 502, the first rare earth pnictide layer is ScN 504, the third rare earth pnictide layer is $Sc_{1-x}Er_xN$ 510, the second rare earth pnictide layer is $ErN_{1-y}P_y$ 506, and the semiconductor layer is Si semiconductor material 508.

Similar to the structures described in FIG. 4, the lattice mismatch between GaN and silicon can be bridged by a PBR buffer. A polygon similar to polygon 440 can be used to navigate a pnictide alloy map, such as that shown in FIG. 1, to determine lattice matched alloys by bridging the lattice mismatch between GaN and silicon, rather than GaN and GaAs (as depicted in polygon 440 in FIG. 4). In this example, the lower layer is GaN semiconductor material 502, the next layer is ScN 504, the third layer is $Sc_{1-x}Er_xN$ 510, the fourth layer is $ErN_{1-y}P_y$ 506 and the final layer is silicon semiconductor material 508. In this example, ScN is gradually transitioned to ErN by increasing the value x in $Sc_{1-x}Er_xN$ layer 510. The variable x ranges from approximately 0 at a bottom surface to approximately 1 at a top surface. ErN is gradually transitioned to ErP by increasing the value y in $ErN_{1-y}P_y$ layer 506. The variable y ranges from approximately 0 at a bottom surface to approximately 1 at a top surface. Because ErP and Si are lattice matched, at the intersection between $ErN_{1-y}P_y$ layer 506 and Si layer 508, the layers $ErN_{1-y}P_y$ layer 506 and Si 508 are lattice matched.

In an example, the first layer is GaN semiconductor material, the second layer is ScN, the third layer is $ScP_xN_{1-x}$, the fourth layer is $Sc_{1-y}Er_yP$ and the final layer is silicon semiconductor material. In this example, because ScN is lattice matched to GaN, the second layer of ScN is epitaxially grown on the first GaN layer. ScN is transitioned to ScP by increasing the value x in the third layer comprising $ScP_xN_{1-x}$. ScP is then transitioned to ErP in a fourth layer by increasing the value y in layer $Sc_{1-y}Er_yP$. The variables x and y each range between 0 and 1, inclusive.

In an example, a two part buffer utilizing quaternary alloys is used to bridge the lattice mismatch between GaN and silicon. In this example, the lower layer is GaN semiconductor material, the next layer is ScN, the third layer is $Sc_{1-x}Er_xN_{1-y}P_y$, and the final layer is silicon semiconductor material. Again, in this example, x and y range between 0 and 1, inclusive. In an extension of this example, a fourth layer is an isolating layer and a fifth layer is $Sc_{1-x}Er_xN_{1-y}P_y$. These fourth and fifth layers are epitaxially grown on the ScN layer and below the silicon layer. The lower GaN material and upper silicon material are electrically isolated by the fourth layer in this example. The isolating layer can be, for example, an insulating material or a crystalline rare earth oxide (cREO).

FIG. 6 depicts a layer diagram 600 of an embodiment of the systems and methods described herein, in which a III-N layer comprises GaN; a first rare earth pnictide layer comprises ScN; a second rare earth pnictide layer comprises a first alloy comprising Sc, a rare earth material, and N; a third rare earth pnictide layer comprises a second alloy comprising the rare earth material, N, and As, and the semiconductor layer comprises InP. In layer diagram 600, a two part PBR buffer utilizing ternary alloys for a conductive buffer between GaN and InP is illustrated. In this example, the III-N layer 602 is made of GaN, the first rare earth pnictide layer 604 is made of ScN, the third rare earth pnictide layer 610 is made of $Sc_{1-x}Gd_xN$, the second rare earth pnictide layer 606 is made of $GdN_{1-y}P_y$, and the semiconductor layer is InP semiconductor material 608.

Similar to the structure described in FIG. 4, a PBR buffer design can be used to bridge the lattice mismatch between GaN and InP. A polygon similar to polygon 440 can be used to navigate a pnictide alloy map, such as that shown in FIG. 1, to determine lattice matched alloys by bridging the lattice mismatch between GaN and InP, rather than GaN and GaAs (as depicted in polygon 440 in FIG. 4). In this example, the lower layer is GaN semiconductor material 602, the second layer is ScN 604, the third layer is $Sc_{1-x}Gd_xN$ 610, the fourth layer is $GdN_{1-y}As_y$ 606 and the top layer is InP semiconductor material 608. In this example, ScN is gradually transitioned to GdN by increasing the value x in $Sc_{1-x}Gd_xN$ layer 610. The variable x ranges from approximately 0 at a bottom surface to approximately 1 at a top surface. GdN is gradually transitioned to GdAs by increasing the value y in $GdN_{1-y}As_y$ layer 606. The variable y ranges from approximately 0 at a bottom surface to approximately 1 at a top surface. Because GdAs and InP are lattice matched, at the intersection between $GdN_{1-y}As_y$ layer 606 and InP layer 608, the layers $GdN_{1-y}As_y$ 606 and InP 608 are lattice matched.

In one example, a two part buffer utilizing quaternary alloys is used to bridge the lattice mismatch between GaN and InP. In this example, the lower layer is GaN semiconductor material, the next layer is ScN, the third layer is $Sc_{1-x}Gd_xN_{1-y}As_y$, and the final layer is InP semiconductor material.

In one example, a fourth layer is an isolating layer and a fifth layer is $Sc_{1-x}Gd_xN_{1-y}As_y$. These fourth and fifth layers are epitaxially grown on the ScN layer and are below the silicon layer. The lower GaN material and upper InP material are electrically isolated by the isolating layer in this example. As used herein, two materials are considered electrically isolated if the leakage current between the two materials is less than 1 mA. Therefore, in this example, the leakage current between the lower GaN material and the upper InP material in this embodiment is less than 1 mA.

FIG. 7 depicts a layer diagram 700 showing a stack including a pnictide buffer region containing three rare-earth pnictides and an isolating layer. The stack 700 contains similarities to the layer diagram 300 shown in FIG. 3 with the addition of an isolating layer within the third rare earth pnictide layer. The base of the stack 700 is a III-N layer 702 that has a first lattice constant. A first rare earth pnictide layer 704 is epitaxially grown over the III-N layer 702. This first rare earth pnictide layer 704 has a second lattice constant that is different from the first lattice constant. The difference between the first lattice constant and the second lattice constant can be, for example, less than one percent, less than one half of a percent, or between one half and one percent. Such a difference can constitute a lattice match between the III-N layer and the first rare earth pnictide layer.

A second rare earth pnictide layer 706 is epitaxially grown over a top third rare earth pnictide layer 714. The second rare earth pnictide 706 has a third lattice constant that is different from both the first and second lattice constants. A semiconductor layer 708 is epitaxially grown over the second rare earth pnictide layer. In one embodiment, the semiconductor has a fourth lattice constant that is different from the first, second, and third lattice constants. In one embodiment, the difference between the second lattice constant and the third lattice constant is, for example, less than two percent, less than one percent, less than one half of a percent, between one half and one percent, or any other suitable amount. In one embodiment, the third lattice constant can be, for example, graded to match the first lattice constant at a lower surface and match the fourth lattice constant at an upper surface. Therefore, the choice of rare earth pnictides to use in such a structure as is shown in simplified layer diagram 700 can be based on the difference in lattice constant between materials.

A bottom third rare earth pnictide layer 710 is epitaxially grown over the first rare earth pnictide layer 704. The bottom third rare earth pnictide layer 710 has a fifth lattice constant that varies across a thickness of the third rare earth pnictide layer. The bottom third rare earth pnictide layer has a first surface adjacent to the first rare earth pnictide layer and a second surface adjacent to an isolating layer 712. The fifth lattice constant can be, for example, graded to match the first lattice constant at the first surface and to match the second lattice constant at the second surface. Alternatively, the fifth lattice constant can, for example, be the same throughout and be the same as or different than the first, second, third, or fourth lattice constants.

The isolating layer 712 has a first surface adjacent to the bottom third rare earth pnictide layer 710 and a second surface adjacent to a top third rare earth pnictide layer 714. The upper semiconductor 708 and lower III-N material 702 are electrically isolated by the isolating layer 712 inserted between. The isolating layer 712 can be, for example, an insulating material or dielectric, such as a cREO layer.

In one embodiment, an isolating layer is included in the PBR and positioned adjacent and in contact with a III-N layer. In this embodiment, the isolating layer is used as a gate dielectric for a first device and a gate contact/terminal is connected to the PBR near the lower surface so a lower portion or layer of the PBR acts as the gate of the first device. For example, a bottom III-N layer is part of a first device. An isolating layer, such as cREO, is epitaxially grown on the III-N layer. A series of rare earth pnictide layers (such as layers 304, 310, 306 in FIG. 3) are epitaxially grown above the isolating layer. In this example, the bottom isolating layer and the series of rare earth pnictide layers are included in the PBR. A semiconductor layer, which is part of a second device, is epitaxially grown on the upper most layer of the PBR. A first electrical contact is connected to the bottom III-N layer. A second electrical contact is connected to the uppermost layer of the PBR (such as second rare earth pnictide layer 306 in FIG. 3). A third electrical contact is connected to one of the lower layers of the PBR (such as first rare earth pnictide layer 304 or third rare earth pnictide layer 310 in FIG. 3). Since most pnictide alloys are semi metallic, the overall PBR is likely to be electrically conducting. Therefore to isolate the semiconductor material (that could be part of a second device) from the III-N layer (that could be part of the first device), an isolating layer is inserted into the PBR between an upper portion or layer of the PBR and the lower surface of the semiconductor material (such as described below in relation to FIG. 8). Either or both of these examples can be incorporated in a final structure. Note also that with the correct design of the inserted isolating layer, and with adjacent PBR on both top and bottom of the isolating layer these layers themselves would function as a resonant tunnel diode, thereby adding functionality to the overall epitaxial structure.

FIG. 8 depicts a layer diagram 800 including electrical contacts, according to an illustrative implementation. Electrical contacts are used to connect and communicate between devices. The structure 800 contains similarities to the layer diagram 700 of FIG. 7 with the addition of two contacts 816, 818. Layer 802 is similar to layer 702; layer 804 is similar to layer 704; layer 806 is similar to layer 706; layer 808 is similar to layer 708; layer 810 is similar to layer 710; layer 812 is similar to layer 712; layer 814 is similar to layer 714; and the descriptions of the layers 702, 704, 706, 708, 710, 712, and 714 in FIG. 7 are applicable to the layers 802, 804, 806, 808, 810, 812, and 814 in FIG. 8.

A first electrical contact 816 is connected to the bottom third rare earth pnictide layer 810. A second electrical contact 818 is connected to the second rare earth pnictide layer 806. In this way, the PBR comprising the first, second, bottom third, and top third rare earth pnictide layers, in addition to the isolating layer, can, for example, add functionality to the device structure represented by layer diagram 800 by providing a front contact material 816 for a first device built in the III-N layer 802 and both a front contact material 808 for the first device built in the III-N layer 802 and a back contact material for a second device built in the semiconductor layer 808. The isolating layer 812 electrically isolates semiconductor 808 and III-N layer 802.

FIG. 9 depicts layer diagrams including a pnictide buffer region with a gradient, according to an illustrative implementation. Schematic representation 902, similar to schematic representation 434 in FIG. 4, illustrates a PBR buffer design for bridging the lattice mismatch between GaN and InP. Polygon 918 can be used to navigate a pnictide alloy map (such as that shown in FIG. 1) to determine lattice matched alloys. Polygon 918 bridges the lattice mismatch between GaN and GdAs, rather than GaN and GaAs as shown in polygon 440 in FIG. 4. Because ScN is lattice matched to GaN, a layer 926 of ScN is first epitaxially grown on GaN layer 924. ScN is transitioned (represented by arrow 922) to GdAs, which is lattice matched with InP.

Layer diagram 904 illustrates a two part buffer utilizing quaternary alloys for an upper InP semiconductor material 912 and a lower GaN semiconductor material 906. In this example, the lower layer is GaN semiconductor material 906, the first rare earth pnictide layer is ScN 908, the second rare earth pnictide layer is $Sc_{1-x}Gd_xN_{1-y}As_y$ 910, and the upper layer is InP semiconductor material 912.

One way to achieve the layer diagram 904 is through a PBR buffer utilizing a quaternary alloy for a conductive buffer between GaN and InP. In this example, the III-N layer is GaN semiconductor material 906, the first rare earth pnictide layer is ScN 908, the second rare earth pnictide layer is $Sc_{1-x}Gd_xN_{1-y}As_y$ 910, and the semiconductor layer is InP semiconductor material 912. The rare earth pnictide layer $Sc_{1-x}Gd_xN_{1-y}As_y$ 910 is graded along its thickness. At the surface between $Sc_{1-x}Gd_xN_{1-y}As_y$ 910 and ScN 414, "x" and "y" are at their lowest values. The variable x ranges from approximately 0 at a bottom surface to approximately 1 at a top surface. The variable y ranges from approximately 0 at a bottom surface to approximately 1 at a top surface. As the material is grown and approaches the layer GaN semiconductor material 906, x and y increase along arrow 916. Arrow 916 represents the same grading as arrow 922. As x increases the amount of Sc in $Sc_{1-x}Gd_xN_{1-y}As_y$ 910 decreases, while the amount of Gd increases. As y increases the amount of N in $Sc_{1-x}Gd_xN_{1-y}As_y$ 910 decreases, while the amount of As increases. At the intersection between InP 904 and $Sc_{1-x}Gd_xN_{1-y}As_y$ 910, $Sc_{1-x}Gd_xN_{1-y}As_y$ 910 x and y will have increased until the $Sc_{1-x}Gd_xN_{1-y}As_y$ 910 layer primarily comprises GdAs. At that point, $Sc_{1-x}Gd_xN_{1-y}As_y$ 910 can be considered lattice matched to InP 904, because InP and GdAs are lattice matched, as is shown in FIG. 1.

This example may include an isolating layer, such as cREO, within layer 910. The addition of an isolating layer within layer 910 electrically isolates the upper and lower semiconductor materials. It should be noted that the above examples simply illustrate some quaternary and ternary PBR buffers that can be engineered and are intended to demonstrate that a variety of semiconductor materials can be accommodated using the engineering concept of the present invention.

In one embodiment, a layer diagram could depict a two part PBR buffer utilizing ternary alloys for a conductive buffer between GaN and GdAs. In this example, the lower layer is GaN semiconductor material, the next layer is ScN, the third layer is $Sc_{1-x}Gd_xN$, the fourth layer is $GdN_{1-y}As_y$, and the final layer is InP semiconductor material.

One method of growing the above is a modulated process for the growth of pnictide buffers. In this process, the rare-earth element and the group V source(s) are used separately and are switched into a growth chamber alternately. The rare-earth element (RE1 or RE2) is introduced into the chamber for a period of time $t_{RE}$, a pause is uninitiated for a time $t_{pause}$, and then the group V material (e.g. As, N, P, Sb) is introduced into the chamber for a time $t_v$. As also illustrated, this modulated scheme allows for a pause between the rare-earth and group V steps. The complete buffer is then made up of N repeats of the RE/pause/V cycle. It should be noted that the process could, alternatively, start with the group V step.

In instances in which a PBR buffer is constructed from two ternary alloys, one possible process scheme includes the growth of a $(RE1_{1-x}RE2_x)V$ alloy. The two rare-earth components (RE1 and RE2) are switched independently using a time ratio equal to the composition ration x/(1−x), where x is between 0 and 1, inclusive. This way the ternary alloy is constructed from binary alloy components. A similar scheme can be constructed for a ternary alloy, $RE(V1_{1-y}V2_y)$, using two group V components (e.g. V1 and V2), wherein y is between 0 and 1 inclusive. This second process scheme could also use the modulated approach described above. Any grading required (or desired) across or within the PBR buffer can be linear, stepwise, superlinear, or use any other scheme known to those practiced or knowledgeable in the art. For any abrupt interface or interfaces within the PBR buffer the two adjacent components can be grown non-stoichiometric (i.e. rare earth element rich or group V rich) to facilitate the change in material across the interface.

Various changes and modifications to the embodiments herein chosen for purposes of illustration will readily occur to those skilled in the art. To the extent that such modifications and variations do not depart from the spirit of the invention, they are intended to be included within the scope thereof.

A lattice constant, or lattice parameter or lattice spacing, refers to the physical dimension of unit cells in crystal lattice. Lattice constants are typically on the order of several angstroms (Å). Matching lattice constants between semiconductor materials allows layers to be grown without a change in crystal structure.

Group V elements are the elements belonging to group V (as used in semiconductor physics) of the periodic table. Group V is understood in the field to include nitrogen (N), phosphorous (P), arsenic (As), antimony (Sb), and bismuth (Bi). This group of elements is understood to be the same group referred to as, for example, Group 15 in modern IUPAC notation, the nitrogen family, or pnictogens.

The lanthanide series includes the metals cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Throughout this disclosure it should be understood that the term rare-earth elements or rare-earth metals includes scandium and yttrium, as well as all lanthanides.

The growth and/or deposition described herein can be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HYPE), pulsed laser deposition (PLD), and/or physical vapor deposition (PVD).

III-nitride (III-N) materials are semiconducting materials comprising nitrogen and one or more Group III elements. Common Group III elements used to form III-nitride materials include aluminum, gallium, and indium. III-nitride materials have large direct band gaps, making them useful for high-voltage devices, radio-frequency devices, and optical devices. Furthermore, because multiple Group III elements can be combined in a single III-nitride film in varying compositions, the properties of III-nitride films are highly tunable.

In some embodiments, the III-V and III-nitride materials used in the layer structures described herein are grown using metal-organic chemical vapor deposition (MOCVD). In MOCVD, one or more Group III precursors react with a Group V precursor to deposit a III-nitride film on a substrate. Some Group III precursors include trimethylgallium (TMGa) as a gallium source, trimethylaluminum (TMA) as an aluminum source, and trimethylindium (TMI) as an indium source. Ammonia is a Group V precursor which can be used as a nitrogen source. Tert-butylarsine and arsine are Group V precursors which can be used as arsenic sources. Tert-butylphosphine and phosphine are Group V precursors which can be used as phosphorous sources.

In some embodiments, the III-V and III-nitride materials used in the layer structures described herein are grown using molecular beam epitaxy (MBE). MBE is an epitaxy method for thin-film deposition of single crystals that takes place in high or ultra-high vacuum. In MBE, precise beams of gaseous atoms or molecules are fired at a heated substrate. When the molecules land on the substrate's surface, they condense and build up slowly and systematically in ultra-thin layers.

As described herein, a layer means a substantially-uniform thickness of a material covering a surface. A layer can be either continuous or discontinuous (i.e., having gaps between regions of the material). For example, a layer can completely cover a surface, or be segmented into discrete regions, which collectively define the layer (i.e., regions formed using selective-area epitaxy). A layer structure means a set of layers, and can be a stand-alone structure or part of a larger structure. A III-nitride structure means a structure containing III-nitride material, and can contain additional materials other than III-nitrides, a few examples of which are Si, a silicon oxide ($SiO_x$), silicon nitride ($Si_xN_y$) and III-V materials. Likewise, a III-V structure means a structure containing III-V material, and can contain additional materials other than III-Vs, a few examples of which are Si, a silicon oxide ($SiO_x$), silicon nitride ($Si_xN_y$) and III-nitride materials (a subset of III-Vs).

"Monolithically-integrated" means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this can mean either (1) the material is in direct contact with the substrate; or (2) the material is in contact with one or more transitional layers that reside on the substrate.

Single-crystal means a crystal structure that comprises substantially only one type of unit-cell. A single-crystal layer, however, may exhibit some crystal defects such as stacking faults, dislocations, or other commonly occurring crystal defects.

Single-domain (or monocrystal) means a crystalline structure that comprises substantially only one structure of unit-cell and substantially only one orientation of that unit cell. In other words, a single-domain crystal exhibits no twinning or anti-phase domains.

Single-phase means a crystal structure that is both single-crystal and single-domain.

Crystalline means a crystal structure that is substantially single-crystal and substantially single-domain. Crystallinity means the degree to which a crystal structure is single-crystal and single-domain. A highly crystalline structure would be almost entirely, or entirely single-crystal and single-domain.

Epitaxy, epitaxial growth, and epitaxial deposition refer to growth or deposition of a crystalline layer on a crystalline substrate. The crystalline layer is referred to as an epitaxial layer. The crystalline substrate acts as a template and determines the orientation and lattice spacing of the crystalline layer. The crystalline layer can be, in some examples, lattice matched or lattice coincident. A lattice matched crystalline layer can have the same or a very similar lattice spacing as the top surface of the crystalline substrate. A lattice coincident crystalline layer can have a lattice spacing that is an integer multiple, or very similar to an integer multiple, of the lattice spacing of the crystalline substrate. In some embodiments, an number may be considered an integer if it is within 0.5% of an integer. For example, numbers between 1.95 and 2.05 may be considered the integer 2. In some embodiments, the lattice spacing in lattice matched crystalline structures may be approximately 0.1%, 0.2%, 0.3%, 0.4%, 0.5%, or any other suitable percentage. In general, the lattice spacing in lattice matched crystalline structures may be less than 1%. Alternatively, the lattice spacing of the crystalline substrate can be an integer multiple, or very similar to an integer multiple, of the lattice spacing of the lattice coincident crystalline layer. The quality of the epitaxy is based in part on the degree of crystallinity of the crystalline layer. Practically, a high quality epitaxial layer will be a single crystal with minimal defects and few or no grain boundaries.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, gallium nitride, silicon carbide, gallium oxide, germanium, alumina, gallium-arsenide, indium-phosphide, silica, silicon dioxide, borosilicate glass, pyrex, and sapphire.

A rare earth pnictide material is a material that contains one or more group V elements and one, two, or more rare earth (RE) elements. The rare earth elements include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), luthium (Lu), scandium (Sc) and yttrium (Y).

Semiconductor-on-Insulator means a composition that comprises a single-crystal semiconductor layer, a single-phase dielectric layer, and a substrate, wherein the dielectric layer is interposed between the semiconductor layer and the substrate. This structure may include silicon-on-insulator ("SOP") compositions.

Carrier concentration means the number of majority carriers per unit volume.

Charge carrier density denotes the number of charge carriers per volume.

Interface means the surface between two layers or regions of dissimilar crystalline semiconductors.

Semiconductor-on-insulator compositions include but are not limited to a silicon, germanium, or silicon-germanium "active" layer. In other words, exemplary semiconductor-on-insulator compositions include, without limitation: silicon-on-insulator, germanium-on-insulator, and silicon-germanium-on-insulator. In some embodiments, various structures of silicon that may be used are Si<100>, Si<110>, Si<111>, for example.

A first layer described and/or depicted herein as "on" or "over" a second layer can be immediately adjacent to the second layer, or one or more intervening layers can be between the first and second layers. An intervening layer described and/or depicted as "between" first and second layers can be immediately adjacent to the first and/or the second layers, or one or more additional intervening layers may be between the intervening layer and the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results. Additionally, the different examples described are not singular examples and features from one example may be included within the other disclosed examples. Accordingly, it will be understood that the claims are not to be limited to the examples disclosed herein, but is to be understood from the technical teachings provided above, as those teachings will inform the person of skill in the art.

What is claimed is:

1. A structure comprising:
   a III-N layer with a first lattice constant;
   a first rare earth pnictide layer with a second lattice constant epitaxially grown over the III-N layer, wherein a first difference between the first lattice constant and the second lattice constant is less than one percent;
   a second rare earth pnictide layer with a third lattice constant epitaxially grown over the first rare earth pnictide layer; and
   a semiconductor layer with a fourth lattice constant epitaxially grown over the second rare earth pnictide layer, wherein a second difference between the third lattice constant and the fourth lattice constant is less than one percent.

2. The structure of claim 1, wherein the first rare earth pnictide layer comprises an alloy comprising Sc and a rare earth element, wherein the alloy is represented by $Sc_xRE_{1-x}N$, wherein x is greater than zero and less than or equal to one.

3. The structure of claim 1, wherein the III-N layer is part of a device epitaxially grown over one of a GaN substrate, a Si substrate, a SiC substrate, and a sapphire substrate.

4. The structure of claim 1, wherein the III-N layer comprises a GaN material.

5. The structure of claim 1, wherein the III-N layer comprises one or more of Al, Ga, and In.

6. The structure of claim 1, wherein the second rare earth pnictide layer comprises at least two rare earth pnictide layers, wherein each of the rare earth pnictide layers has a different fixed lattice constant.

7. The structure of claim 1, further comprising a third rare earth pnictide layer between the first rare earth pnictide layer and the second rare earth pnictide layer, wherein:
   the third rare earth pnictide layer has a fifth lattice constant that varies across a thickness of the third rare earth pnictide layer,
   the third rare earth pnictide layer has a first surface adjacent to the first rare earth pnictide layer and a second surface adjacent to the second rare earth pnictide layer, and
   the fifth lattice constant is graded to match the first lattice constant at the first surface and to match the second lattice constant at the second surface.

8. The structure of claim 7, wherein:
   the III-N layer comprises GaN,
   the first rare earth pnictide layer comprises ScN,
   the second rare earth pnictide layer comprises a first alloy comprising Sc, a rare earth element, and N,
   the third rare earth pnictide layer comprises a second alloy comprising the rare earth element, N, and As, and
   the semiconductor layer comprises GaAs.

9. The structure of claim 7, wherein:
   the III-N layer comprises GaN,
   the first rare earth pnictide layer comprises ScN,
   the second rare earth pnictide layer comprises a first alloy comprising Sc, a rare earth element, and N,
   the third rare earth pnictide layer comprises a second alloy comprising the rare earth element, N, and P, and
   the semiconductor layer comprises Si.

10. The structure of claim 7, wherein:
    the III-N layer comprises GaN,
    the first rare earth pnictide layer comprises ScN,
    the second rare earth pnictide layer comprises a first alloy comprising Sc, a rare earth element, and N, the third rare earth pnictide layer comprises a second alloy comprising the rare earth element, N, and As, and the semiconductor layer comprises InP.

11. The structure of claim 7, further comprising an isolating layer within the third rare earth pnictide layer.

12. The structure of claim 7, further comprising a first electrical contact connected to the third rare earth pnictide layer, and a second electrical contact connected to the second rare earth pnictide layer.

13. The structure of claim 1, wherein the III-N layer is part of a transistor.

14. The structure of claim 1, wherein the III-N layer is part of a diode.

15. The structure of claim 1, wherein the III-N layer is part of a radio frequency filter.

* * * * *